United States Patent
Fujisawa et al.

(10) Patent No.: US 8,462,239 B2
(45) Date of Patent: Jun. 11, 2013

(54) SOLID-STATE IMAGING DEVICE AND ELECTRONIC IMAGING DEVICE HAVING MULTI-STAGE ELEMENT ISOLATION LAYER

(75) Inventors: Kaoru Fujisawa, Kanagawa (JP); Tetsuya Iizuka, Kanagawa (JP); Kimihiko Sato, Tokyo (JP)

(73) Assignee: Sony Corporation, Tokyo (JP)

( * ) Notice: Subject to any disclaimer, the term of this patent is extended or adjusted under 35 U.S.C. 154(b) by 406 days.

(21) Appl. No.: 12/822,652

(22) Filed: Jun. 24, 2010

(65) Prior Publication Data

US 2011/0007194 A1    Jan. 13, 2011

(30) Foreign Application Priority Data

Jul. 9, 2009    (JP) ................ 2009-162718

(51) Int. Cl.
*H04N 3/14* (2006.01)
*H04N 5/335* (2006.01)

(52) U.S. Cl.
USPC .... 348/294; 348/302; 348/311; 257/E21.183; 257/E21.617

(58) Field of Classification Search
USPC ............... 348/294, E05.091, 302, 305, 311
See application file for complete search history.

(56) References Cited

U.S. PATENT DOCUMENTS

| | | | | |
|---|---|---|---|---|
| 6,784,015 B2 * | 8/2004 | Hatano et al. | | 438/75 |
| 7,198,976 B2 | 4/2007 | Hirata | | |
| 7,776,643 B2 * | 8/2010 | Nomura et al. | | 438/79 |
| 2007/0042519 A1 * | 2/2007 | Nomura et al. | | 438/34 |
| 2007/0069238 A1 * | 3/2007 | Tatani et al. | | 257/187 |
| 2009/0002537 A1 * | 1/2009 | Kobayashi | | 348/311 |
| 2009/0096902 A1 * | 4/2009 | Kobayashi | | 348/296 |

FOREIGN PATENT DOCUMENTS

JP   2004-165462   6/2004

* cited by examiner

*Primary Examiner* — Hung Lam
(74) *Attorney, Agent, or Firm* — Oblon, Spivak, McClelland, Maier & Neustadt, L.L.P.

(57) ABSTRACT

A solid-state imaging device and an electronic device that includes the solid-state imaging device prevents shifting of a photoelectric conversion region due to long-wavelength light passing to subsurface portions of the solid-state imagine device. The device include a photo diode having an upper layer of a first conductivity type formed over a second layer having an accumulation region of a second conductivity type. The upper layer is a light-receiving portion of the photodiode. A multi-stage element isolation layer is included and has a plurality of layers of the first conductivity type, such that a first lateral side of a first stage of the multi-stage layer abuts the accumulation portion, and a second stage of the multi-stage layer is separated by a width W from the accumulation region of an intermediate portion of a second conductivity type.

18 Claims, 5 Drawing Sheets

SOLID-STATE IMAGING DEVICE AND ELECTRONIC IMAGING DEVICE HAVING MULTI-STAGE ELEMENT ISOLATION LAYER

BACKGROUND

1. Field of the Invention

The present invention relates to a solid-state imaging device and a manufacturing method of a solid-state imaging device. The present invention also relates to an electronic device employing a solid-state imaging device.

2. Description of the Related Art

A solid-state imaging device is largely classified into a CCD (Charge Coupled Device) solid-state imaging device and a CMOS (Complementary Metal Oxide Semiconductor) solid-state imaging device.

In these solid-state imaging devices, a light-receiving portion formed of a photo diode is provided to each pixel and signal charges are generated in the light-receiving portion by photoelectric conversion of light incident on the light-receiving portion. In a CCD solid-state imaging device, signal charges generated in the light-receiving portion are transferred inside a charge transfer portion having a CCD structure and outputted from an output portion after they are converted to a pixel signal. Meanwhile, in a CMOS solid-state imaging device, signal charges generated in the light-receiving portion are amplified pixel by pixel and the amplified signal is outputted to a corresponding signal line as a pixel signal.

In order to prevent leakage of signal charges between adjacent pixels, the solid-state imaging device is provided with a well region for element isolation in a region between one pixel and an adjacent pixel. JP-A-2004-165462 describes a CCD solid-state imaging device configured in such a manner that an element isolation region made up of a multi-stage impurity region is formed between respective adjacent pixels.

According to this CCD solid-state imaging device, when an element isolation region made up of a multi-stage impurity region is formed by ion implantation, anion implantation area to form a lower-layer impurity region is made smaller than an ion implantation area to form an upper-layer impurity region. In this case, charge accumulation regions in the light-receiving portion become the same in the depth direction at the finishing stage after diffusion. Accordingly, because the element isolation region is formed as an impurity region that gradually narrows in the depth direction of the semiconductor substrate, it becomes possible to suppress a decrease of the charge accumulation region in the light-receiving portion caused by diffusion in the impurity region.

SUMMARY

As is shown in FIG. 7, a pixel in a CMOS solid-state imaging device in the related art includes a light-receiving portion 55 formed in a substrate 53 and a read electrode 56 that reads signal charges accumulated in the light-receiving portion 55 to a floating diffusion portion 52. The read electrode 56 is made, for example, of polysilicon and formed on the substrate 53 via an insulating film 58 at the end of a region where the light-receiving portion 55 is formed. Also, one pixel including the light-receiving portion 55 and the read electrode 56 is isolated from an adjacent pixel by an element isolation region 54 formed between these pixels. The element isolation region 54 is formed of a LOCOS oxide film 59 formed on the top of the substrate 53 and element isolation layers 57 in multiple stages formed beneath the LOCOS oxide film 59 by carrying out ion implantation several times.

In the CMOS solid-state imaging device in the related art configured as above, light L collected to the pixel center by an unillustrated on-chip lens goes incident on the light-receiving portion 55 in the substrate 53. Of the incident light, light having a short wavelength, for example, 500 nm or shorter, is absorbed into a region 0.5 µm to 1 µm deep from the surface of the substrate 53 and undergoes photoelectric conversion in the absorbed region. Also, light having a long wavelength, for example, 600 nm to 700 nm, is absorbed at a position deeper than 0.5 µm to 1 µm from the surface of the substrate 53 and undergoes photoelectric conversion in the absorbed region.

In this instance, the light collection center S1 of the pixel is set to the center position of the light-receiving portion 55 and is present at the center of a line linking the end of the read electrode 56 and the end of the element isolation region 54. However, diagonal long-wavelength light L1 comes inside the substrate 53 by passing through the read electrode made of polysilicon. Accordingly, photoelectric conversion of long-wavelength light takes place even in a region under the read electrode 56 that is not the photo-receiving region 55. Signal charges e are thus generated also under the read electrode 56. More specifically, a photoelectric conversion 60 by long-wavelength light spreads not only across the light-receiving portion 55 but also under the read electrode 56. The center S2 of the photoelectric conversion region 60 therefore shifts from the light collection center S1. Meanwhile, because short-wavelength light hardly passes through the read electrode 56 made of polysilicon, photoelectric conversion of short-wavelength light takes place in the light-receiving portion 55 alone. The center of the photoelectric conversion region of short-wavelength light therefore coincides with the light collection center S1.

As has been described, in the solid-state imaging device in the related art, the photoelectric conversion region 60 by light on the long wavelength side spreads from under the read electrode 56 to the ends of the element isolation layers 57. The center S2 of the photoelectric conversion region 60 therefore shifts from the light collection center S1 of the pixel. Although no problem occurs in the characteristic with incident light having a short wavelength, deviation in sensitivity (sensitivity irregularity) occurs in individual pixels with incident light having a long wavelength. In addition, shifting of the center can cause inhomogeneous shading or the like depending on pixel arrays and the pixel characteristic becomes wavelength dependent.

Thus, it is desirable to provide a solid-state imaging device that suppresses sensitivity irregularity and shading. It is also desirable to provide an electronic device employing such a solid-state imaging device.

According to an embodiment of the present invention, as discussed herein, and as recognized by the present inventors, it becomes possible to obtain a solid-state imaging device that suppresses sensitivity irregularity and shading caused by the wavelength dependency of incident light. Also, it becomes possible to obtain an electronic device that achieves an enhanced image quality by employing such a solid-state imaging device.

DESCRIPTION OF EMBODIMENTS

Hereinafter, a solid-state imaging device, a manufacturing method thereof, and an example of an electronic device according to embodiments of the present invention will be described with reference to FIG. 1 through FIG. 6 in order as specified below. It should be appreciated that the present invention is not limited to embodiments described below.

1. First Embodiment: Solid-State Imaging Device
1-1. Configuration of Overall Solid-State Imaging Device
1-2. Configuration of Major Portion
1-3. Manufacturing Method
2. Second Embodiment: Electronic Device <1. First Embodiment: Solid-State Imaging Device>

[1-1. Configuration of Overall Solid-State Imaging Device]

Figure 1:
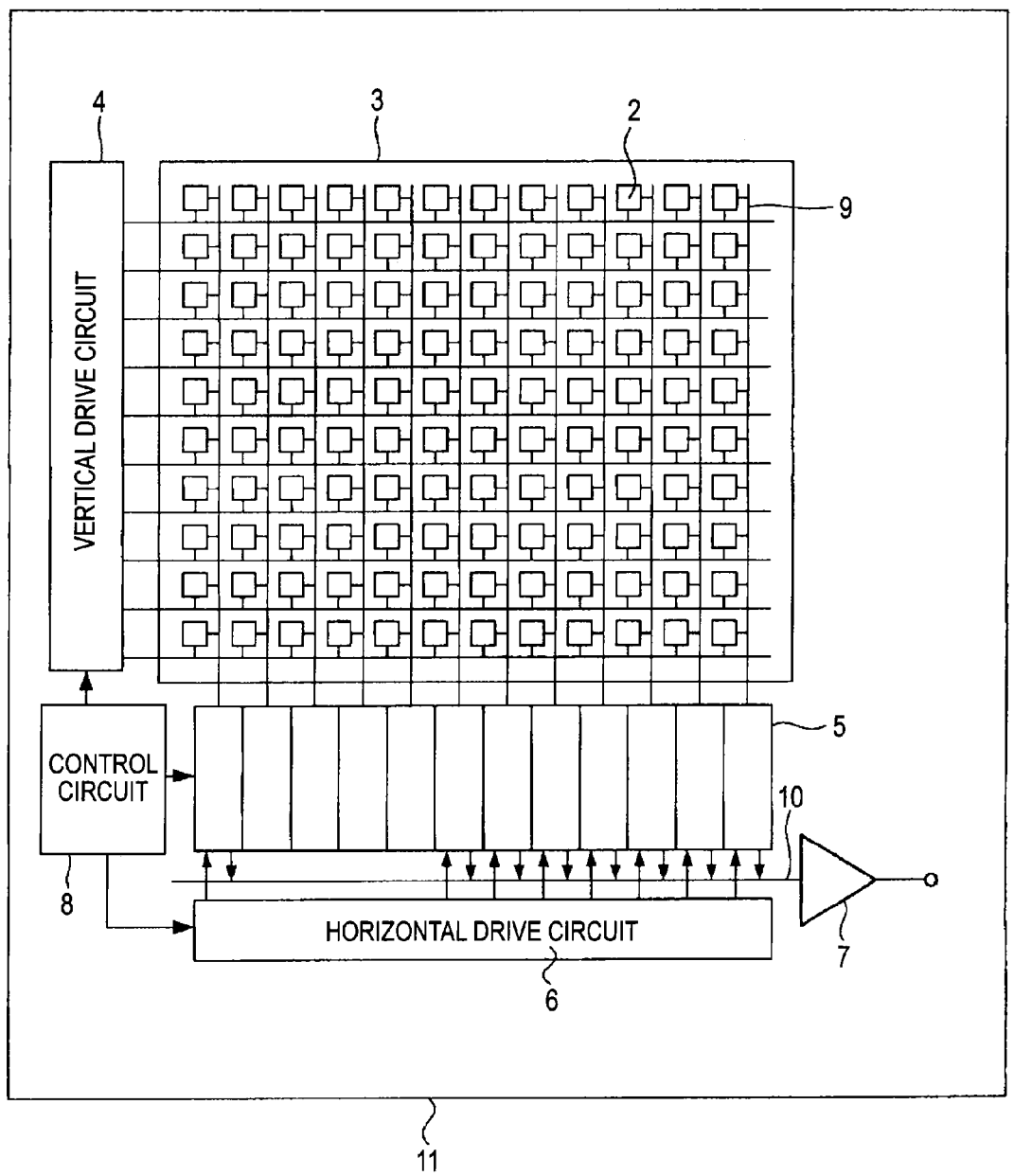
FIG. 1 is a view schematically showing the configuration of an overall CMOS solid-state imaging device according to a first embodiment of the present invention.

FIG. 1 is a view schematically showing the configuration of an overall CMOS solid-state imaging device 1 according to a first embodiment of the present invention.

The solid-state imaging device 1 of this embodiment includes a pixel portion 3 formed of a plurality of pixels 2 arrayed on a substrate 11 made of silicon, a vertical drive circuit 4, column signal processing circuits 5, a horizontal drive circuit 6, an output circuit 7, a control circuit 8, and so forth.

Each pixel 2 includes a light-receiving portion formed of a photo diode and a plurality of MOS transistors, and a plurality of the pixels 2 are aligned regularly in the form of 2D arrays on the substrate 11. MOS transistors forming the pixel 2 may be four MOS transistors including a transfer transistor, a reset transistor, a selection transistor, and an amplifier transistor or three transistors excluding a selection transistor.

The pixel portion 3 includes a plurality of the pixels 2 aligned regularly in the form of 2D arrays. The pixel portion 3 includes an effective pixel region in which signal charges generated through photoelectric conversion by actually receiving light are amplified and from which the amplified signal charges are read to the column signal processing circuits 5 and an optical black pixel region (not shown) from which optical black as the reference of a black level is outputted. The optical black pixel region is normally formed on the outer periphery of the effective pixel region.

The control circuit 8 generates a clock signal used as the reference of operations of the vertical drive circuit 4, the column signal processing circuits 5, and the horizontal drive circuit 6, etc. and a control signal according to a vertical synchronizing signal, a horizontal synchronizing signal, and a master clock. The clock signal and the control signal generated in the control circuit 8 are inputted into such as the vertical drive circuit 4, the column signal processing circuits 5, and the horizontal drive circuit 6.

The vertical drive circuit 4 is formed, for example, of a shift register and selectively scans the respective pixels 2 in the pixel portion 3 sequentially row by row in the vertical direction. The vertical drive circuit 4 supplies pixel signals according to signal charges generated in the photo diodes of the respective pixels 2 correspondingly to amounts of received light to the column signal processing circuits 5 via vertical signal lines.

The column signal processing circuits 5 are disposed, for example, for respective columns of the pixels 2 and apply signal processing, such as noise removal and signal amplification, to signals outputted from the pixels 2 in one row using a signal from the optical black pixel region (not shown but formed on the periphery of the effective pixel region) pixel column by pixel column. Horizontal selection switches (not shown) are provided in the output stages of the column signal processing circuits 5 and connected to a horizontal signal line 10.

The horizontal drive circuit 6 is formed, for example, of a shift register and sequentially selects the respective column signal processing circuits 5 by sequentially outputting horizontal scan pulses, so that the respective column signal processing circuits 5 output pixel signals to the horizontal signal line 10.

The output circuit 7 applies signal processing to signals supplied sequentially from the respective column signal processing circuits 5 via the horizontal signal line 10 and outputs the resulting signals.

[1-2. Configuration of Major Portion]

Figure 2:
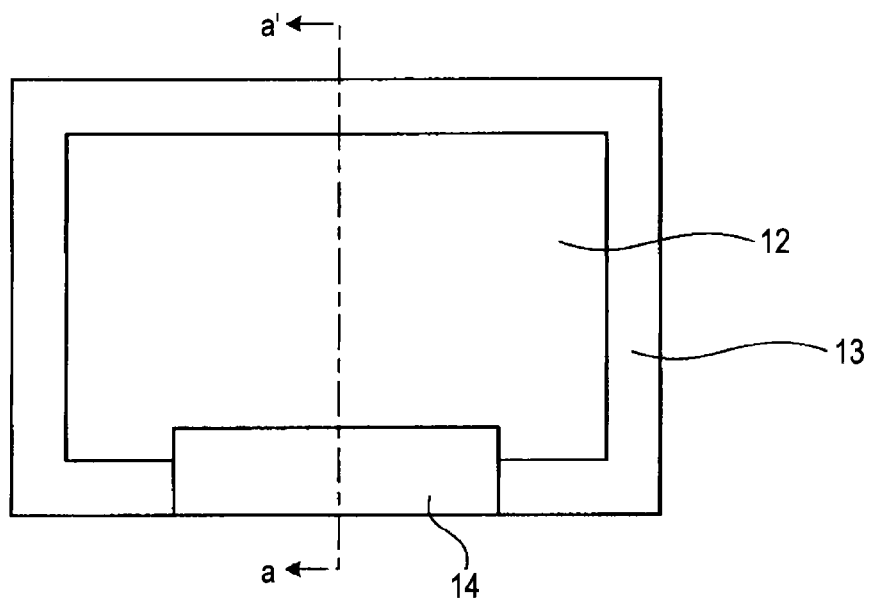
FIG. 2 is a plan view schematically showing the configuration of a pixel portion in the solid-state imaging device according to the first embodiment of the present invention.

FIG. 2 shows a plan view schematically showing the configuration of one pixel in the solid-state imaging device of this embodiment.

As is shown in FIG. 2, the pixel 2 in the solid-state imaging device of this embodiment includes an element isolation region 13 that isolates one pixel from an adjacent pixel, a light-receiving portion 12 formed in a region surrounded by the element isolation region 13, and a pixel electrode 14 formed at an end of the light-receiving portion 12.

Figure 3:
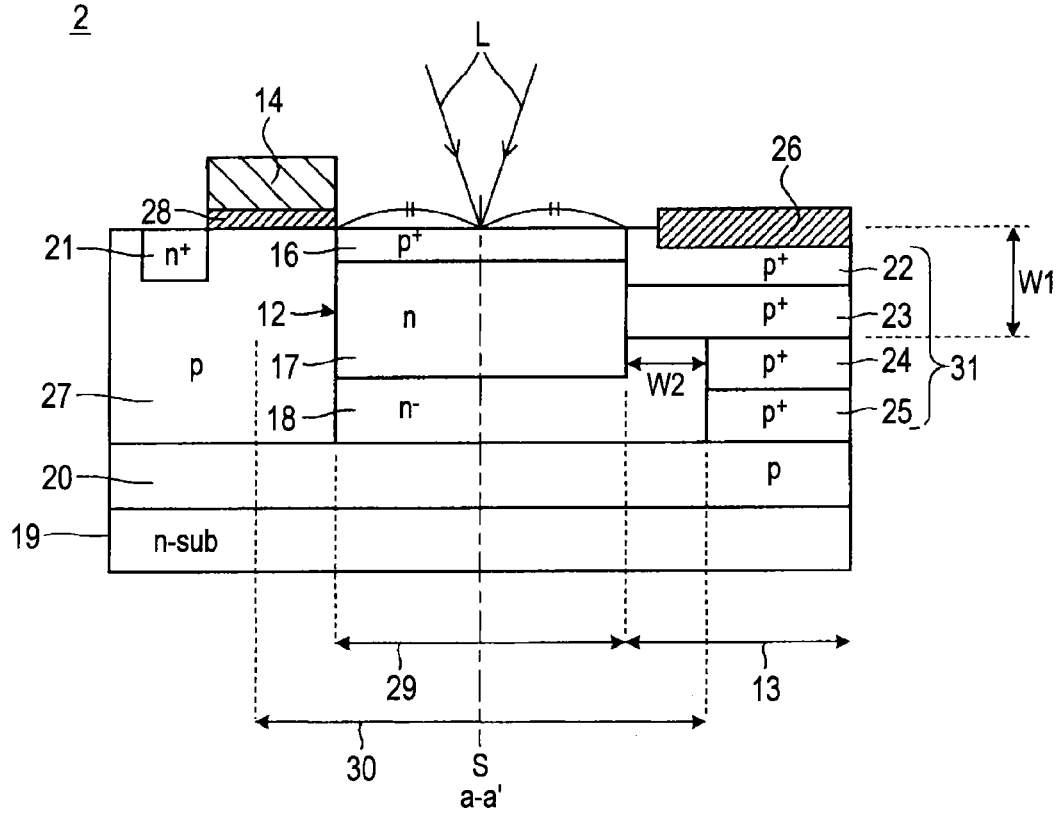
FIG. 3 is a view showing the configuration in cross section taken on line a-a' of FIG. 2.

FIG. 3 shows the configuration in cross section taken online a-a' of FIG. 2. It is a view showing the configuration of the pixel electrode 14, the light-receiving portion 12, and the element isolation region 13 present in a region opposing the pixel electrode 14 with the light-receiving portion 12 interposed therebetween when viewed in cross section. In this embodiment, descriptions will be given on the assumption that a first conductivity type is an n-type and a second conductivity type is a p-type.

As is shown in FIG. 3, a substrate 19 in which to form the pixels 2 is made, for example, of a first conductivity type (n-type) semiconductor. An overflow barrier layer 20 formed of a second conductivity type (p-type) well region is formed in the deepest region of the substrate 19 from the surface side.

The light-receiving portion 12 includes a dark current suppression region 16 formed of a high-concentration p-type impurity region formed on the outermost surface, which is the light incident side of the substrate 19, and a charge accumulation region 17 formed of an n-type impurity region formed beneath the dark current suppression region 16. This "dark current" relates to an observed phenomenon about leakage current that flows through a transistor even when it is turned off. As recognized by the present inventor, the leakage current gives rise to an irregular image on a picture taken by a user, and is thus referred to as a "dark current". Since in region 16 electric charges are trapped, the dark current is suppressed to some extent and is thus referred to herein as a "dark current suppression region".

A low-concentration n-type impurity region (n⁻ region) 18 is formed in a region between the charge accumulation region 17 and the overflow barrier layer 20. In the light-receiving portion 12, a chief photo diode is formed owing to the p-n junction between the dark current suppression region 16 and the charge accumulation region 17. A dark current generated at the interface of the substrate 19 is suppressed by the dark current suppression region 16 as the dark current is trapped by holes, which are many carriers in the dark current suppression region 16. Also, signal charges generated in the light-receiving portion 12 are accumulated chiefly in the charge accumulation region 17.

The pixel electrode 14 is formed on the top of the substrate 19 via a gate insulating film 28 in a region adjacent to the light-receiving portion 12, and is formed, for example, of polysilicon. In this embodiment, the pixel electrode 14 is a read electrode that forms a transfer transistor. On the surface of the substrate 19 on the side opposite to the region where the light-receiving portion 12 is formed with the pixel electrode 14 interposed therebetween, a floating diffusion portion 21 formed of a high-concentration n-type impurity region is formed. Also, a portion under the pixel electrode 14 and beneath the floating diffusion portion 21 is a p-type impurity region 27.

In addition, the element isolation region 13 formed in a region opposing the pixel electrode 14 with the light-receiving portion 12 interposed therebetween includes an element isolation portion 26 made of LOCOS (Local Oxidation of Silicon) and a multi-stage element isolation layer 31 formed beneath the element isolation portion 26. The multi-stage element isolation layer 31 is made up of impurity diffusion layers in multiple stages.

Besides LOCOS, STI (Shallow Trench Isolation) can be used as the element isolation portion 26. This embodiment has described a case where the element isolation portion 26 is formed. However, there may be a case where isolation is provided not by forming the element isolation portion 26 using an oxide film but by using only an element isolation layer made up of impurity diffusion layers.

The multi-stage element isolation layer 31 is made up of impurity diffusion layers formed by ion implanting a p-type impurity several times at a high concentration in the depth direction of the substrate 19. In this embodiment, of the multi-stage element isolation layer 31, impurity diffusion layers present within a width W1 (herein, 0.5 µm to 1 µm) from the surface of the substrate 19 as the light irradiation surface are referred to as upper-stage element isolation layers 22 and 23. Also, impurity diffusion layers formed below the upper-stage element isolation layers 22 and 23 are referred to as lower-stage element isolation layers 24 and 25.

The upper-stage element isolation layers 22 and 23 are formed from the end of the light-receiving portion 12 to under the element isolation portion 26. In this instance, because the interface of the element isolation portion 26 to the substrate 19 is surrounded by the impurity diffusion layers forming the upper-stage element isolation layers 22 and 23 in which the p-type impurity is diffused at a high concentration, a dark current generated by a defect on the interface of the element isolation portion 26 is suppressed.

The lower-stage element isolation layers 24 and 25 are formed from a position apart by a predetermined distance W2 from the end of the light-receiving portion 12 (in this case, the end of the charge accumulation region 17 forming the light-receiving portion 12) to under the element isolation portion 26. More specifically, the lower-stage element isolation layers 24 and 25 are formed in a region narrower than the region of the upper-stage element isolation layers 22 and 23 and remote from the light-receiving portion 12. It is preferable that the distance W2 is 0.1 µm or more and it is set to about 0.2 µm in this embodiment. W2 may also be 0.3 µm, 0.4 µm, or 0.5 µm, for example.

In the solid-state imaging device having the above configuration, light L collected to the pixel center by an unillustrated on-chip lens goes incident on the light-receiving portion 12 in the substrate 19. Of the incident light L, light having a short wavelength, for example, blue light having 500 nm or shorter, is absorbed into a region 0.5 µm to 1 µm deep from the surface of the substrate 19 and undergoes photoelectric conversion in the absorbed region. Also, light having a long wavelength, for example, red light having 600 nm to 700 nm, is absorbed at a position deeper than 0.5 µm to 1 µm from the surface of the substrate 19 and undergoes photoelectric conversion in the absorbed region. Signal charges generated and accumulated in the light-receiving portion 12 by photoelectric conversion are read to the floating diffusion portion 21 by applying a predetermined voltage to the pixel electrode 14.

According to the solid-state imaging device of this embodiment, of the multi-stage element isolation layer 31 formed in a region opposing the pixel electrode 14 with respect to the light-receiving portion 12, the lower-stage element isolation layers 24 and 25 are formed apart from the light-receiving portion 12 by a predetermined distance. A depletion layer of the charge accumulation region 17 forming the light-receiving portion 12 thus spreads under the element isolation portion 26. Hence, in a deep region of the substrate 19 where photoelectric conversion of long-wavelength light takes place, a photoelectric conversion region 30 spreads as far as under the element isolation portion 26. Long-wavelength light therefore undergoes photoelectric conversion even in a region between the lower-stage element isolation layers 24 and 25 and the light-receiving portion 12. In this instance, on the side of the pixel electrode 14, too, long-wavelength light having passed through polysilicon undergoes photoelectric conversion in a deep region of the substrate 19 under the pixel electrode 14. Hence, because the photoelectric conversion region 30 for long-wavelength light spreads symmetrically to the both sides, the center S of the photoelectric conversion region 30 coincides with the actual light collection center S of the pixel.

The distance W2 by which the lower-stage element isolation layers 24 and 25 are apart from the light-receiving region 12 varies with an amount of projection of the pixel electrode 14 into the light-receiving portion 12 and the width of the element isolation region 13. The distance W2 is therefore set to a predetermined distance so that the center of the photoelectric conversion region 30 for long-wavelength light coincides with the light collection center S of the pixel.

In a shallow region of the substrate 19 where photoelectric conversion of short-wavelength light takes place, the light-receiving portion 12 is formed in contact with the upper-stage element isolation layers 22 and 23. In addition, short-wavelength light hardly passes through the pixel electrode 14 made of polysilicon. Hence, a photoelectric conversion region 29 for short-wavelength light is present from the end of the pixel electrode 14 to the end of the light-receiving portion 12. The center S of the photoelectric conversion region 29 thus coincides with the light collection center S of the pixel on the short wavelength side, too.

As has been described, according to the solid-state imaging device of this embodiment, the center of the photoelectric conversion region 30 for long-wavelength light, the center of the photoelectric conversion region 29 for short-wavelength light, and the light collection center S of the pixel coincide with one another. Sensitivity irregularity and shading can be therefore reduced. Moreover, the structure of multi-stage element 31 prevents a shift in a center of the photoelectric conversion region along centerline S caused by long-wavelength light that penetrates the pixel electrode 14 and interacts with layer 27.

Also, as has been described, of the multi-stage element isolation layer 31 made up of impurity diffusion layers in multiple stages, the lower-stage element isolation layers 24 and 25 formed at the deeper position in the depth direction are formed apart from the light-receiving portion 12 by a predetermined distance. It is, however, sufficient to adopt this configuration only in a region where the center of the photoelectric conversion causes a shift. For example, on a cross section taken on a line intersecting with the line a-a' of FIG. 2, there will be no event that long-wavelength light passes through inside the substrate 19 to break the symmetrical property of the photoelectric conversion region. Hence, for the multi-stage element isolation layer 31 in the element isolation region 13 on a line intersecting with the line a-a', all the impurity diffusion layers are formed in contact with the light-receiving portion 12.

Owing to the configuration described above, with the solid-state imaging device of this embodiment, the sensitivity to long-wavelength light is enhanced and sensitivity irregularity can be reduced because sensitivity of pixels becomes homogeneous independently of the wavelength of light. In addition, inhomogeneous shading caused by pixel arrays can be improved. Further, a saturated charge amount (Qs) increases because of the configuration that spreads the depletion layer by forming the lower-stage element isolation layers 24 and 25 apart from the light-receiving portion 12 by a predetermined distance. Furthermore, it becomes possible to control a sensitivity ratio formed of a ratio of sensitivity to red light (red sensitivity) with respect to sensitivity to blue light (blue sensitivity) without changing the upper layer shape by using a metal opening made in the top layer of the substrate or by adjusting the size of the on-chip lens.

In the solid-state imaging device of this embodiment, the multi-stage element isolation layer 31 is formed of the upper-stage element isolation layers 22 and 23 in two stages and the lower-stage element isolation layers 24 and 25 in two stages by way of example. It should be appreciated, however, that each of the upper-stage element isolation layer and the lower-stage element isolation layer can be at least one stage and each can be formed in two or more multiple stages.

In the solid-stage imaging device of this embodiment, the pixel electrode 14 is made of polysilicon by way of example. It should be appreciated, however, that the configuration according to the embodiment of the present invention is useful for a solid-state imaging device having a pixel electrode made of amorphous silicon.

In the solid-state imaging device of this embodiment, the pixel electrode 14 is a read electrode by way of example. However, besides the read electrode, the pixel electrode 14 may be a pixel electrode that forms a reset transistor or an amplification transistor. More specifically, in a case where the pixel electrode forming a pixel transistor is formed in a region adjacent to the light-receiving portion, as with this embodiment, the symmetric property of the photoelectric conversion with respect to the light collection center of the pixel is broken on the long wavelength side. In order to avoid this inconvenience, the lower-stage element isolation layers in a region opposing the pixel electrode with the light-receiving portion interposed therebetween are formed apart from the light-receiving portion. The center of the photoelectric conversion region on the long wavelength side is thus brought into coincidence with the light collection center of the pixel.

[1-3. Manufacturing Method]

FIG. 4A through FIG. 5F are views showing the fabrication sequence of the pixel portion 3 in the solid-state imaging device of this embodiment when viewed in section taken on line a-a' of FIG. 2. A manufacturing method of the solid-state imaging device of this embodiment will now be described using FIG. 4A through FIG. 5F.

Figure 4A:
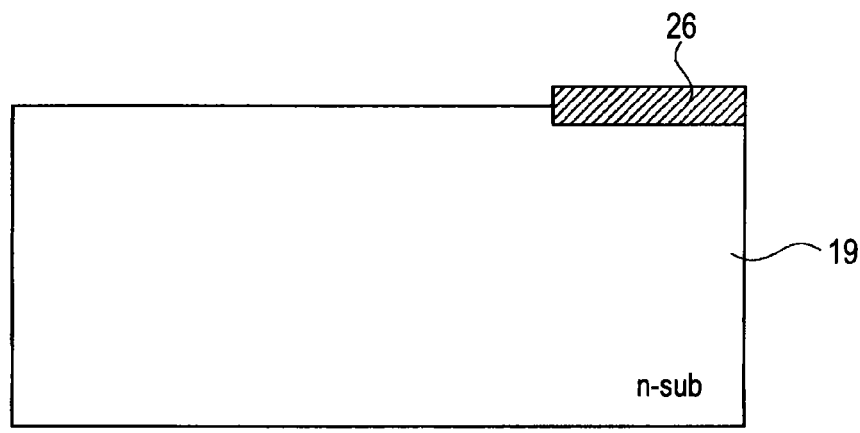
FIG. 4A through FIG. 4C are views showing the fabrication sequence of the solid-state imaging device according to the first embodiment of the present invention.

Initially, as is shown in FIG. 4A, the substrate 19 made of an n-type semiconductor is prepared and the element isolation portion 26 made of LOCOS is formed by selectively oxidizing a predetermined region on the substrate 19 so that one pixel is isolated from an adjacent pixel.

Figure 4B:
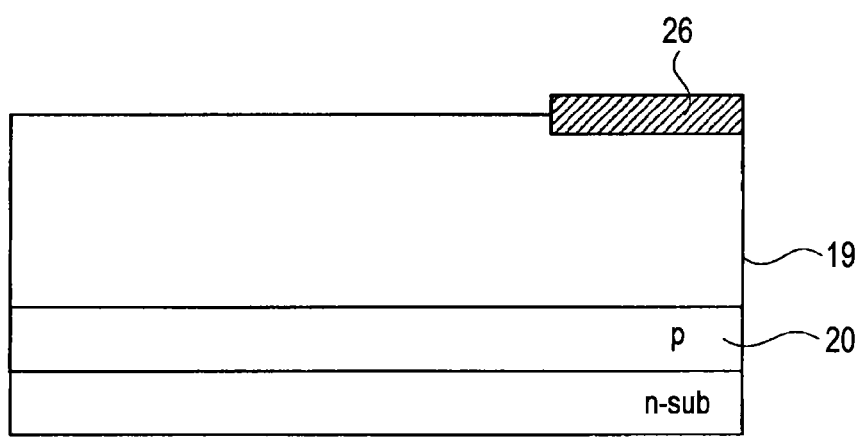

Subsequently, as is shown in FIG. 4B, the overflow barrier layer 20 is formed across the entire surface of the substrate 19 where the pixel portion 3 is formed by ion implanting a p-type impurity into a deep region of the substrate 19.

Figure 4C:
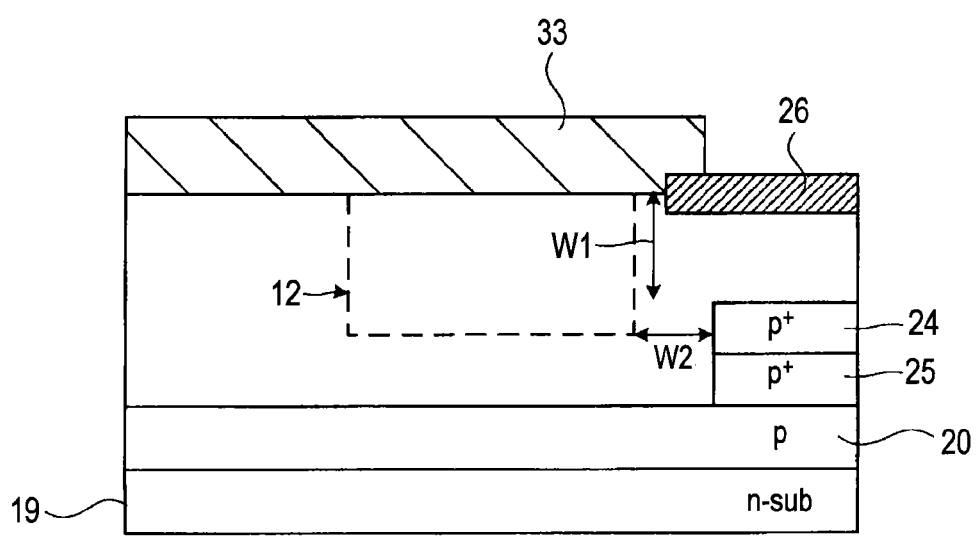

Subsequently, as is shown in FIG. 4C, a mask 33 opening above the element isolation portion 26 that serves as an ion implantation region is formed. A p-type impurity is ion implanted at a high concentration into a region in the substrate 19 between the element isolation portion 26 and the overflow barrier layer 20 and deeper than a depth W1 (herein, 0.5 µm to 1 µm) from the surface of the substrate 19 using the mask 33. The lower-stage element isolation layers 24 and 25 are thus formed. In this case, the lower-stage element isolation layers 24 and 25 in multiple stages (two stages in FIG. 4C) are formed by ion implanting the impurity several times by changing implantation energy. Also, the lower-stage element isolation layers 24 and 25 are formed in a region apart from the region where the light-receiving portion 12 is formed by a predetermined distance W2, for example, about 0.2 µm herein. Accordingly, the lower-stage element isolation layers 24 and 25 are formed so that the ends of the lower-stage element isolation layers 24 and 25 are present under the element isolation portion 26 made of LOCOS. A distance between the ends of the lower-stage element isolation layers 24 and 25 and the region where the light-receiving portion 12 is formed is adjusted with the opening region in the mask 33.

Figure 5D:
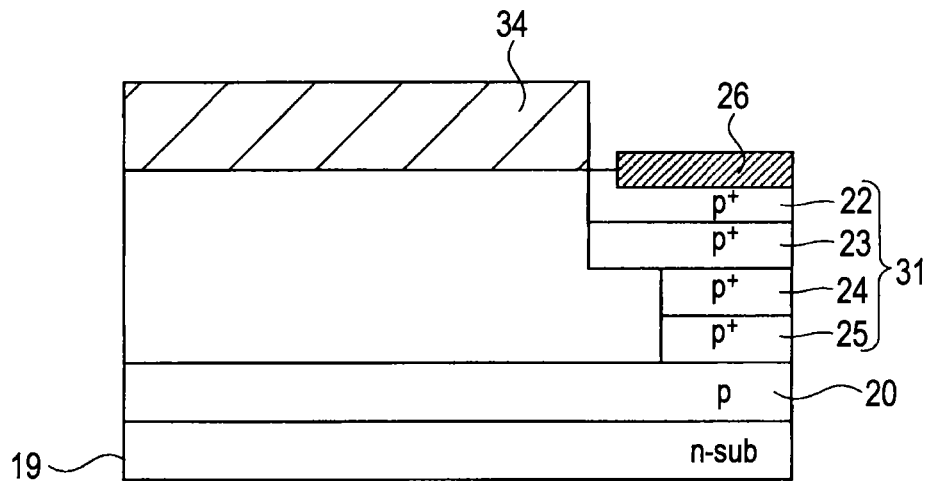
FIG. 5D through FIG. 5F are views showing the fabrication sequence of the solid-state imaging device according to the first embodiment of the present invention.

Subsequently, as is shown in FIG. 5D, a mask 34 different from the mask 33 used in the preceding step and opening above the element isolation portion 26 that serves as an ion implantation region is formed. The mask 34 is formed in such a manner that the end of the opening shifts closer to the light-receiving portion 12 than the end of the element isolation portion 26. The upper-stage element isolation layers 22 and 23 are then formed by ion implanting a p-type impurity at a high concentration in a region between the element isolation portion 26 and the lower-stage element isolation layers 24 and 25 using the mask 34. In this case, the upper-stage element isolation layers 22 and 23 in multiple stages (two stages in FIG. 5D) are formed by ion implanting the impurity several times by changing the implantation energy. In addition, the upper-stage element isolation layers 22 and 23 are formed from the region where the light-receiving portion 12 is formed to under the element isolation portion 26 so as to cover the interface between the element isolation portion 26 and the substrate 19.

Figure 5E:
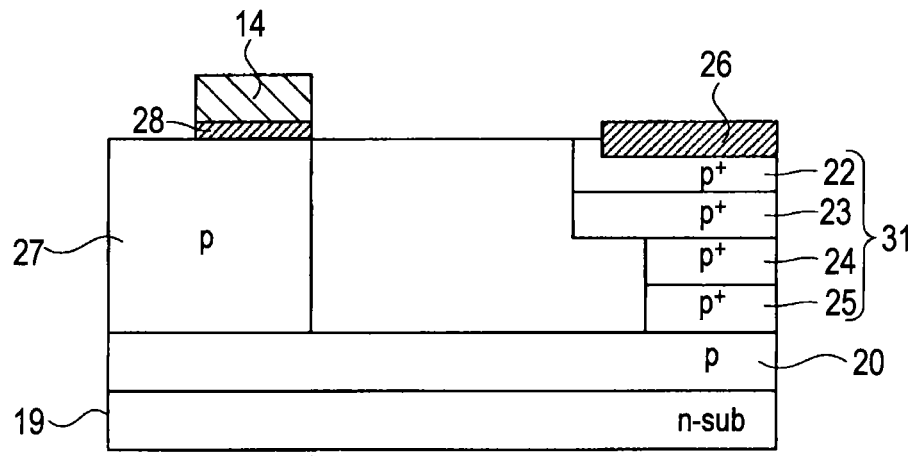

Subsequently, as is shown in FIG. 5E, the p-type impurity region 27 is formed under the pixel electrode 14 and beneath a region where the floating diffusion portion 21 is formed by ion implanting a p-type impurity. Then, the gate insulating film 28 formed, for example, of a silicon dioxide film is formed on the top of the substrate 19 adjacently to the region where the light-receiving portion 12 is formed and the pixel electrode 14 made of polysilicon is formed on the gate insulating film 28.

Figure 5F:
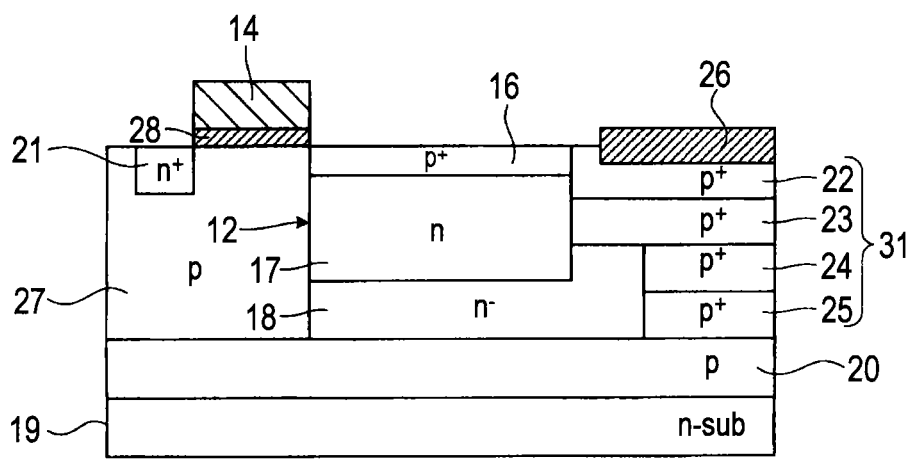

Thereafter, as is shown in FIG. 5F, the light-receiving portion 12 formed of the charge accumulation region 17 and the dark current suppression region 16 is formed in a region between the end of the pixel electrode 14 and the ends of the upper-stage element isolation layers 22 and 23 by ion implanting a desired impurity. Also, the n⁻ region 18 is formed in a region between the charge accumulation region 17 and the overflow barrier layer 20 because of the impurity concentration of the n-type substrate 19. Further, the floating diffusion portion 21 is formed in the surface of the substrate 19 on the side opposite to the light-receiving portion 12 with respect to the pixel electrode 14 by ion implanting an n-type impurity at a high concentration.

Thereafter, the solid-state imaging device of this embodiment is completed by forming a wiring layer, a color filter layer, an on-chip lens, and so forth in the same manner as with the fabrication sequence in the related art.

According to this embodiment, the lower-stage element isolation layers 24 and 25 can be formed apart from the light-receiving portion 12 by separately forming the lower-stage element isolation layers 24 and 25 and the upper-stage element isolation layers 22 and 23 by changing the masks in the step of forming the multi-stage element isolation layer 31. Also, the manufacturing method of this embodiment makes it possible to obtain a solid-state imaging device in which the center S of the photoelectric conversion region 30 for long-wavelength light coincides with the light collection center S of the pixel as is shown in FIG. 3.

Also, according to the manufacturing method of the solid-state imaging device of this embodiment, ion implantation in the depth direction is carried out separately several times. It is therefore possible to control an amount of an impurity to be implanted into impurity diffusion layers that serves as a suitable element isolation layer.

Further, the manufacturing method of the solid-state imaging device of this embodiment has been described using a case where the light-receiving portion 12 is formed after the pixel electrode 14 is formed. It should be appreciated, however, that the light-receiving portion 12 may be formed in the step before the pixel electrode 14 is formed.

The embodiment above has described a case where the present invention is applied to a CMOS solid-state imaging device provided with a matrix of unit pixels that detect signal charges corresponding to an amount of incident light as a physical quantity. It should be appreciated, however, that applications of the present invention are not limited to the CMOS solid-state imaging device. Applications of the present invention are not limited to general column-system solid-state imaging devices in which one column circuit is provided per pixel column in the pixel portion having a 2D matrix of pixels, either.

Further, applications of the present invention are not limited to a solid-state imaging device that picks up an image by detecting a distribution of an amount of incident visible light, and the present invention is also applicable to a solid-state imaging device that picks up an image from a distribution of an incident amount of an infrared ray, an X-ray, particles, and so forth. Largely speaking, the present invention is applicable to general solid-state imaging devices (physical quantity distribution detecting device), such as a fingerprint detection sensor, configured to pick up an image by detecting a distribution of a physical quantity of other types, such as a pressure and an electrostatic capacity.

Applications of the present invention are not limited to a solid-state imaging device configured to read a pixel signal from each unit pixel by scanning respective unit pixels in the pixel portion sequentially row by row, either. The present invention is also applicable to an X-Y address type solid-state imaging device that selects arbitrary pixels pixel by pixel and reads out signals pixel by pixel from the selected pixels.

The solid-state imaging device may be fabricated in the form of one chip or in the form of a module furnished with an imaging capability in which the pixel portion and the signal processing portion or the optical system are collectively packaged.

The present invention is not limited to the embodiment described above and various modifications are possible without deviating from the scope of the invention. The embodiment above described a case where an n-channel MOS transistor is chiefly formed. It should be appreciated, however, that a p-channel MOS transistor can be formed as well. In the case of a p-channel MOS transistor, the conductivities are reversed in the configuration shown in the respective drawings.

The embodiment above described a case where an n-type semiconductor substrate is used as the substrate. It should be appreciated, however, that a p-type semiconductor substrate is also available.

Applications of the present invention are not limited to a solid-state imaging device and the present invention is also applicable to an imaging device. The imaging device referred to herein include a camera system, such as a digital still camera and a video camera, and an electronic device furnished with an imaging capability, such as a mobile phone, and may also include the module incorporated into an electronic device as described above, that is, a camera module.

<2. Second Embodiment: Electronic Device>

Figure 6:
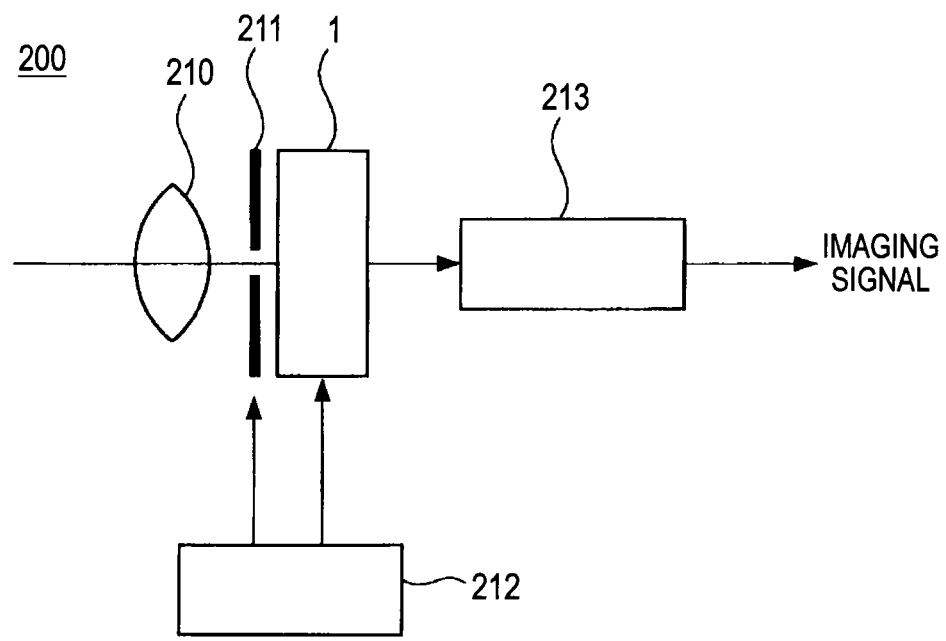
FIG. 6 is a view schematically showing the configuration of an electronic device according to a second embodiment of the present invention.
Figure 7:
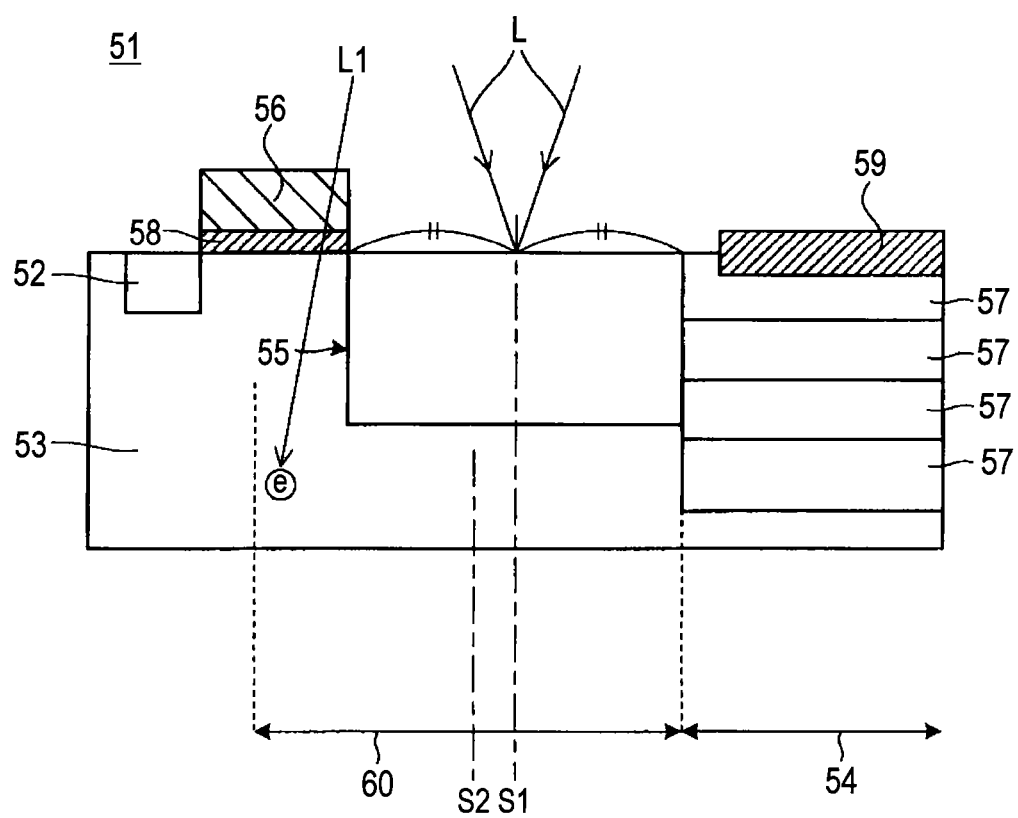
FIG. 7 is a cross section schematically showing the configuration of a solid-state imaging device in the related art.

An electronic device according to a second embodiment of the present invention will now be described. FIG. 6 is a view schematically showing the configuration of an electronic device 200 according to the second embodiment of the present invention.

The electronic device 200 of this embodiment is a case where the solid-state imaging device 1 of the first embodiment above is employed in an electronic device (camera).

The electronic device 200 of this embodiment has the solid-state imaging device 1, an optical lens 210, a shutter device 211, a drive circuit 212, and a signal processing circuit 213.

The optical lens 210 forms an image of light (incident light) from an object on the imaging area of the solid-state imaging device 1. Accordingly, signal charges are accumulated in the solid-state imaging device 1 for a certain period.

The shutter device 211 controls a light irradiation period and a light shielding period for the solid-state imaging device 1.

The drive circuit 212 supplies a drive signal that controls a transfer operation of the solid-state imaging device 1 and a shutter operation of the shutter device 211. A signal transfer of the solid-state imaging device 1 is carried out by the drive signal (timing signal) supplied from the drive circuit 212. The signal processing circuit 213 carries out signal processing of various types. A video signal after the signal processing is stored in a storage medium, such as a memory, or outputted to a monitor.

Because sensitivity irregularity and shading are suppressed by the solid-state imaging device 1, the electronic device 200 of this embodiment can achieve an enhanced image quality.

The electronic device 200 to which the solid-state imaging device 1 is applicable is not limited to a camera. The solid-state imaging device 1 is also applicable to a digital still camera and further to an imaging device, such as a camera module for mobile equipment represented, for example, by a mobile phone.

The present application contains subject matter related to that disclosed in Japanese Priority Patent Application JP 2009-162718 filed in the Japan Patent Office on Jul. 9, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
a photodiode having an upper layer of a first conductivity type formed over a second layer having an accumulation region of a second conductivity type, the upper layer having a light-receiving surface of the photodiode;
a multi-stage element isolation layer including a plurality of layers of the first conductivity type,
wherein a first lateral side of a first stage of the multi-stage layer abutting the accumulation portion, and
a second stage of the multi-stage layer being separated by a width W of an intermediate portion is sufficiently wide to cause a center S of the accumulation region of the second conductivity type to remain centered with respect to a center of the light-receiving portion of the photodiode when a long-wavelength light passes through a pixel electrode.

2. The solid-state device of claim 1, further comprising:
an element isolation portion, the first stage of the multi-stage layer being disposed between the element isolation portion and the second stage of the multi-stage layer.

3. The solid-state device of claim 1, wherein: the plurality of layers of the multi-stage layer comprises a third layer, the third layer abutting the accumulation portion and being longer than the second stage, and the first layer being disposed between the third layer and the second layer.

4. The solid-state device of claim 3, wherein: the plurality of layers of the multi-stage layer comprises a fourth layer, the fourth layer being separated by the width W from the accumulation region by the intermediate portion of the second conductivity type.

5. The solid-state device of claim 1, wherein: the intermediate portion being deeper than 0.5 μm from the light-receiving surface of the photodiode.

6. The solid-state device of claim 5, wherein: the intermediate portion being deeper than 1 μm from the light-receiving surface of the photodiode.

7. The solid-state device of claim 1, wherein: the width W of the intermediate portion being at least 0.1 μm.

8. The solid-state device of claim 1, wherein: the width W of the intermediate portion being in an inclusive range of 0.1 μm through 0.5 μm.

9. The solid-state device of claim 1, further comprising:
the pixel electrode formed on an opposite side with respect to a center of the light-receiving surface of the photodiode than the multi-layer structure.

10. The solid-state device of claim 9, wherein:
the pixel electrode comprises a material that permits long-wavelength light to pass.

11. The solid-state device of claim 10, wherein
the pixel electrode comprising polysilicon.

12. An electronic imaging device, comprising:
a lens that receives and passes light; and
a solid state component disposed in optical alignment the lens to receive light that has passed through the lens, the solid state component including
a photodiode having an upper layer of a first conductivity type formed over a second layer having an accumulation region of a second conductivity type,
the upper layer having a light-receiving surface of the photodiode, and
a multi-stage element isolation layer including a plurality of layers of the first conductivity type, wherein a first lateral side of a first stage of the multi-stage layer abutting the accumulation portion, and a second stage of the multi-stage layer being separated by a width W of an intermediate portion is sufficiently wide to cause a center S of the accumulation region of the second conductivity type to remain centered with respect to a center of the light-receiving portion of the photodiode when a long-wavelength light passes through a pixel electrode.

13. The electronic device of claim 12, further comprising:
a shutter that controls a light irradiation period and light shielding period for the solid-state component, wherein the shutter being disposed between the lens and the solid-state component.

14. The electronic device of claim 13, further comprising:
a drive circuit that supplies a drive signal that controls a transfer operation of the solid-state imaging device and a shutter operation of the shutter.

15. The electronic device of claim 14, further comprising:
a signal processing section that receives an electric signal from the drive circuit via the transfer operation and forms a video signal from the electric signal.

16. The electronic device of claim 12, wherein
the lens and the solid state component are disposed in one of a video camera, digital still camera and a mobile phone.

17. The electronic device of claim 12, wherein
the solid-state component further comprising: a pixel electrode formed on an opposite side with respect to a center of the light-receiving surface of the photodiode than the multi-layer structure.

18. The electronic device of claim 17, wherein:
the pixel electrode comprises a material that permits long-wavelength light to pass.

* * * * *